United States Patent [19]

Veisz et al.

[11] 4,451,804

[45] May 29, 1984

[54] FOUR-TERMINAL NETWORK

[76] Inventors: György Veisz, Raday u. 34, Eng. El., Budapest IX; Gábor Dávid, Holdvilag u. 1., Budapest XI; Peter Kòszeghy, Damjanich u. 27/a., Budapest VII; Lajos Szekely, Bajcsy-Zsilinszky ut 21., Budapest VI, all of Hungary

[21] Appl. No.: 374,200

[22] Filed: May 3, 1982

[30] Foreign Application Priority Data

Sep. 1, 1981 [HU] Hungary ............................ 2517/81

[51] Int. Cl.³ ............................................. H03H 7/09
[52] U.S. Cl. .................................. 333/177; 333/175; 333/185
[58] Field of Search ............................. 333/167–185, 333/24 R, 12

[56] References Cited

U.S. PATENT DOCUMENTS

| 1,611,932 | 12/1926 | Mathes | 333/177 X |
| 1,613,952 | 1/1927 | Johnson | 333/171 |
| 3,956,717 | 5/1976 | Fisher et al. | 333/179 X |
| 4,313,222 | 1/1982 | Katthän | 333/24 R |

OTHER PUBLICATIONS

"The International Dictionary of Physics and Electronics", D. Van Nostrand, New York, 1961; p. 143.

*Primary Examiner*—Marvin L. Nussbaum
*Attorney, Agent, or Firm*—McGlew and Tuttle

[57] ABSTRACT

A four-terminal network, especially for filtering frequency bands or values, behaves as an ideal winding, therefore ensures high selectivity and, if equipped with an iron core, the possibility of carrying out switch operations. The network includes a pair of closely adjacent inductor coils having parallel turns for current in opposite directions, and equal inductance with a capacitor connected to at least one end of one of the coils.

7 Claims, 16 Drawing Figures

FOUR-TERMINAL NETWORK

FIELD AND BACKGROUND OF THE INVENTION

The invention relates to a four-terminal network comprising capacitance and filter means wherein the filter means contains inductive series means connected with a first output terminal and with a first input terminal which are led to a point lying between a second input terminal and a second output terminal. The proposed four-terminal network has the advantage that its inductive series means behaves as an ideal winding. The four-terminal network according to the invention can be used especially advantageously in electrical and measuring units, wherein a circuit element is necessary which operates as an oscillating circuit.

In theoretical and practical electrotechnics, four-terminal networks are well known. See for example the book by Hanero, J. L. and Willoner, G. entitled *Synthesis of Filters*, published by Prentice-Hall in 1966. The four-terminal networks are connected with their input terminals to a generator and with their output terminals to a load and between these terminals they comprise an element with defined impedance. The four-terminal networks are used first of all as filters in teletechnics, in telecommunication systems, in measuring devices and in control systems. A modification of these four-terminal networks are the T-filters wherein, between the first input terminal, and the corresponding first output terminal two windings are in series connected having the same direction of current flow. These windings can form a transformer if necessary. The windings have a common terminal which is connected to one plate of a capacitor. The other plate of the capacitor is connected to the mentioned point lying between the second input terminal and the second output terminal.

The T-filter is intended to be used in determined frequency domains, wherein it has a relatively low attenutation. In the end regions of the frequency value domain, the slope of attanuation is only 5 to 6 dB/decade for every impedance being used. This value is very low, and in this case a wide transient value domain is associated with the determined frequency range, and so selection is not provided in the form which is sought. The slope of attenuation can be improved if some T-filters are provided in series connected. This solution results in increasing attenuation and in a high decrease in power transmission also in the frequency range where passing is necessary. If the four-terminal network is used as filter it transmits not only the desired frequency range but a relatively wide transient value domain, too. The selectivity of the network has a low level and its characteristics are dependent on the load. If the network must be independent of the load, the T-Filter has a circuit scheme which depends on the load and thus one which can be very sophisticated.

The above mentioned disadvantages may be partly omitted if the T-Filter is constructed as a crystal filter. These filters are characterized by relatively sophisticated construction, and by higher costs following from that fact. Therefore the use of the crystal filter is motivated only in cases, when requirements on the slope in the transient value domain as well as on selectivity are high. The crystal filter has the disadvantage that its parameters are dependent on temperature. The dependence on temperature can be avoided only by a more sophisticated construction or by use of a thermostat.

SUMMARY OF THE INVENTION

The aim of the present invention is to avoid the mentioned disadvantages and to create a simple circuit element being producible in a simple way, with low costs, and behaving as an oscillator circuit of high selectivity.

The invention is based on the recognition that the winding used in a T-filter can be composed not only of parts characterized by the same direction of current flow but that surprisingly, it is more advantageous to compose the winding of adjacent current conductors having opposite directions of current flow. In this way, two direct and if necessary curved conductors lying adjacent one another may be enough to ensure the desired effect, of course, if current flows in them in opposite directions.

The above mentioned recognition has been applied to different models, the corresponding transmission function has been determined and a computer model of the proposed four-terminal network has been established. On the basis of the above mentioned recognition, a four-terminal network has been created which comprises capacitor means and filter means wherein the filter means comprise inductive series means connected to a first output terminal and to a first input terminal and led to a point lying between a second input terminal and a second output terminal. According to the invention the inductive series means are built up with current conducting means fit to one another, connected in series wherein the directions of current flow are selected to be opposite to one another to ensure the possible lower inductance, and in the filter means the current conducting means are connected to the capacitor means.

The inductive series means may be advantageously constructed as a bifilar winding prepared on a common body. It is also advantageous when the inductive series means comprise adjacent conductors, having also direct sections when necessary.

The capacitor means of the four-terminal network according to the invention comprise, in a way which is analogous to the T-filter, a capacitor connected to the common point of the current conducting means of the inductive series means. The capacitor means may be composed of two capacitors, connected to the input as well as to the output of the inductive series means in the filter means. The capacitance of these capacitors may be equal. It may further be advantageous if the capacitor means are composed of three capacitors, i. e. the above mentioned two solutions are united in a four-terminal network.

It is also advantageous if respective windings are enclosed between the filter means and the first input terminal, as well as between them and the first output terminal, with series or parallel respective capacitors also being connected. The values of inductance as well as of capacitance of these elements are respectively equal.

The windings may be advantageously equipped with iron cores.

The four-terminal network according to the invention ensures at the resonance frequency, as follows from calculation and measurement, a very sleep characteristics, the slope of which is 200 to 220 dB/octave. This value is by some magnitudes higher than the analogous value for the known prior art T-filters. The four-terminal network according to the invention may be produced easily and with minimal cost, and its characteristic does not depend on the load.

Theoretical investigation of the solution as proposed proves that by the proposed way a circuit element is produced which behaves as an ideal winding and at resonance frequency is practically free of loss. The loss of the four-terminal network as proposed followed only from the use of the capacitors.

The object of the invention will be described following purely by way of examples in concrete embodiments that represent some realised modifications of the proposed solution, as well its further modifications which are thought to be advantageous, with reference to the accompanying drawings.

DESCRIPTION OF THE PREFERRED EMBODIMENTS

Figure 1:
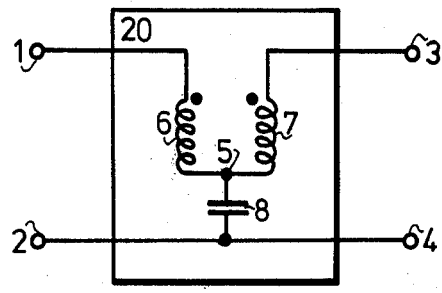
FIG. 1 is a schematic diagram of a four-terminal network according to the invention, characterized by a very narrow domain of transmitted frequencies and specifically being a "hole eliminating filter"

The four-terminal network according to the invention as shown in FIG. 1, comprises filter means 20 connected between a first input terminal 1 and a first output terminal 3 and arranged between a second input terminal 2 and a second output terminal 4. In the filter means 20 inductive series means are arranged, wherein current conducting means or coils 6 and 7 are connected to one another. The inductive series means are connected by their input to the first input terminal 1 and by their output to the first output terminal 3. The inductive series means comprise a common point 5 of the current conducting means 6 and 7. This common point 5 is connected to a point lying between the second input terminal 2 and the second output terminal 4. According to the invention the inductive series means are built up in a way whereby a zero value for their total impedance is provided with the highest possible accuracy. To reach this end, an even number of current conducting means 6 and 7 can be used, and in each pair of the current conducting means the current intensity is the same, but the direction of current flow is opposite for adjacent means 6, 7. The current conducting means 6, 7 have to be arranged beside one another as adjacent as possible. Therefore it is proposed to build up the inductive series means in the form of a bifilar winding. In many forms of use it is advantageously to prepare the current conducting means 6, 7 by laying coil conductors closely adjacent each other with parallel turns which may have direct parts, too.

Figure 6:
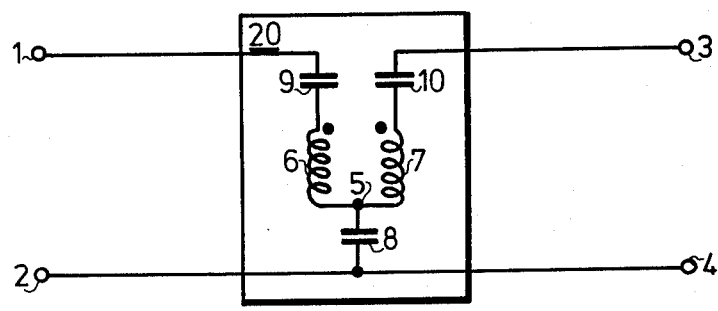
FIG. 6 is a schematic diagram of another four-terminal network according to the invention, usable also as a low-pass filter.

The filter means 20 also has to have a capacitance according to its filtering purpose. The capacitor means may be provided according to the invention by one capacitor 8 (FIG. 1), by two capacitors 9 and 10 (FIG. 3) as well by three capacitors 8, 9 and 10 (FIG. 6). The capacitor 8 is connected by one of its plates to the common point 5. The capacitor 9 is arranged before the input of the filter means 20, between this input and the first input terminal 1, and the capacitor 10 is arranged between the output of the filter means 20 and the first output terminal 3.

Figure 2:
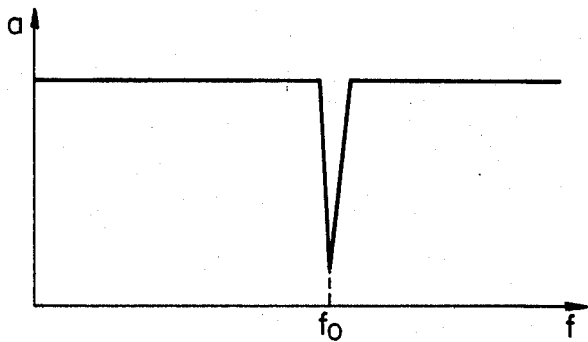
FIG. 2 is a graph showing the amplification—frequency-characteristic of the four-terminal network according to FIG. 1.

If the capacitor means of the four-terminal network according to the invention is provided with one capacitor 8, the network behaves as a band-elimination filter with a very narrow domain of elimination (hole filter). If through the first and second input terminals 1 and 2 a current of frequency f is passed, the amplification a changes with the frequency f according to the characteristic shown in FIG. 2. This characteristic shows that this embodiment of the four-terminal network according to the invention ensures a practically stable amplification a in the whole domain of changes of frequency f, it behaves as an effective resistor without impedance, but in a narrow value domain around a determined resonance frequency $f_0$ the amplification falls very quickly, with a very high slope about 200 to 220 db/octave. Owing to this property the proposed four-terminal network with the described scheme of connections can be effectively used e.g. for signaling the reaching of a determined frequency value. The very steep change of the amplification ensures a highly accurate signaling if necessary. The value of the capacitance for capacitor 8 is to be selected advantageously in the domain from pikofarads to mikrofarads. The lower values result in decreasing the deepness and in increasing slope of frequency cross-over, the higher values lead, inversely, to increasing deepness and decreasing slope of the frequency cross-over. If the inductive series means consist of windings, the number of their turns has influence on the above mentioned relations.

Figure 3:
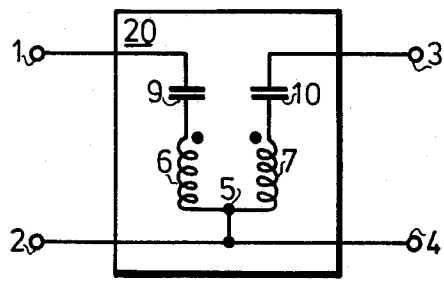
FIG. 3 is a schematic diagram of a four-terminal network according to the invention, usable as a high-pass filter.
Figure 4:
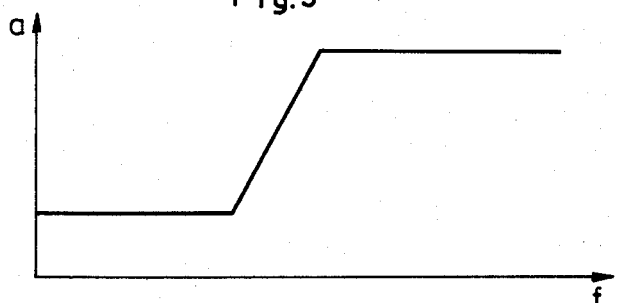
FIG. 4 is a graph showing the amplification—frequency-characteristic of the four-terminal network according to FIG. 3.

If the capacitor means consist of two capacitors 9 and 10 (as shown in FIG. 3), a high-pass filter is created with characteristics according to the FIG. 4. This four-terminal network shows an interesting property: it generates an ideal sinus wave if to the first and second input terminals 1 and 2 a signal is provided which has the form of a Diracs delta. If it is used as a filter, as shown in FIG. 4, it transmits the higher frequencies with higher amplification. The deepness of the frequency cross-over may be regulated easily with capacitors 9 and 10 having different capacitance values. With increasing difference of the capacitance values, the deepness of frequency cross-over increases.

If the capacitor means of the inventive four-terminal network consist of three capacitors (as shown in FIG. 6) the slope of the frequency cross-over decreases.

The four-terminal network according to the invention will be analyzed further in more details on the basis of different embodiments shown purely by way of example.

EXAMPLE 1

Figure 5:
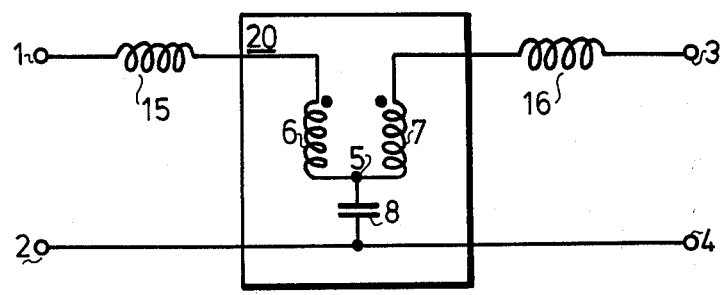
FIG. 5 the scheme of connections of a four-terminal network according to the invention, usable as a low-pass filter.
Figure 7:
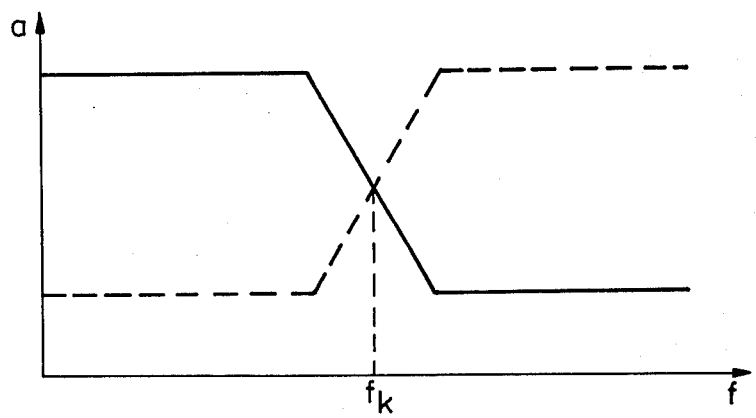
FIG. 7 is a graph showing the amplification—frequency-characteristic of a circuit comprising the four-terminal networks according to FIG. 5 and FIG. 6 in parallel connection, that is of a "cross filter"

A filter, termed a cross filter by the authors, is built up from two four-terminal networks according to the invention. The first of them is equipped with capacitor means consisting of three capacitors and is connected parallel to the second one that comprises filter means based on one capacitor (See FIG. 5 and FIG. 6). In the latter network the filter means consist further of windings 15, 16, wherein the winding 15 is connected to the first input terminal 1 and to the inductive series means, and the winding 16 is connected to the first output terminal 3 and to the inductive series means. The parallel connection of the inventive four-terminal networks results in a filter with characteristic according to the FIG. 7, wherein the continuous line represents the network according FIG. 5, and the broken line the network as shown in FIG. 6. The frequency cross-over has a characteristic cross-frequency denoted by $f_k$.

EXAMPLE 2

Figure 8:
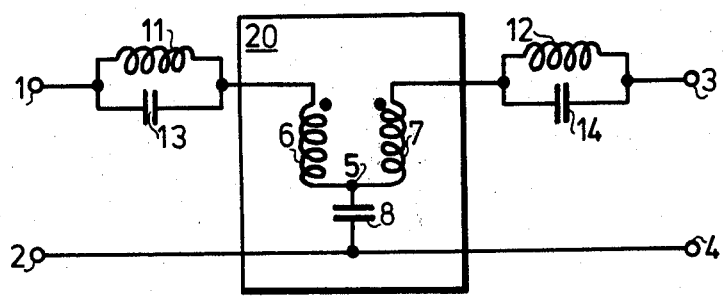
FIG. 8 is a schematic diagram of a four-terminal network according to the invention, usable as a band-elimination filter.
Figure 9:
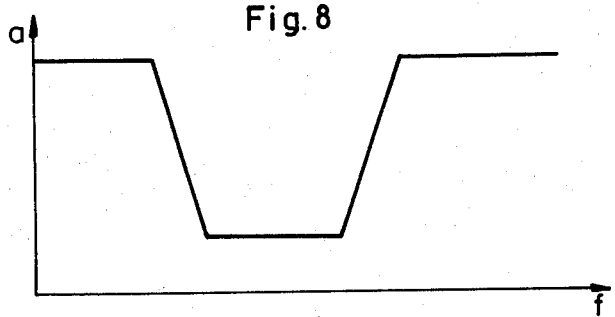
FIG. 9 is a graph showing the amplification—frequency-characteristic of the four-terminal network according to FIG. 8.

The four-terminal circuit according to the invention is equipped with filter means connected with parallel members. Each parallel member comprises a winding 11, 12 and a capacitor 13, 14, respectively, wherein the capacitors 13, 14 are connected parallel with the corresponding windings. A parallel member is connected to the first input terminal 1, and the other parallel member is connected to the first output terminal 3 (FIG. 8). The windings 11 and 12 have advantageously the same impedance value, and the capacitors 13, 14 may be characterized by the same capacitance value. If the equal values are ensured, the characteristics according to FIG. 9 will be obtained.

EXAMPLE 3

Figure 10:
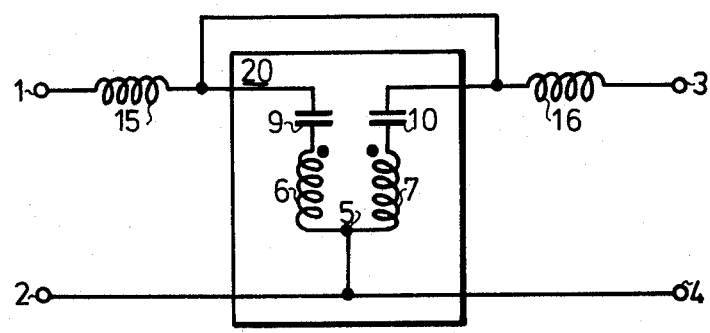
FIG. 10 is a schematic diagram of a four terminal network according to the invention, usable as a low-pass filter.
Figure 11:
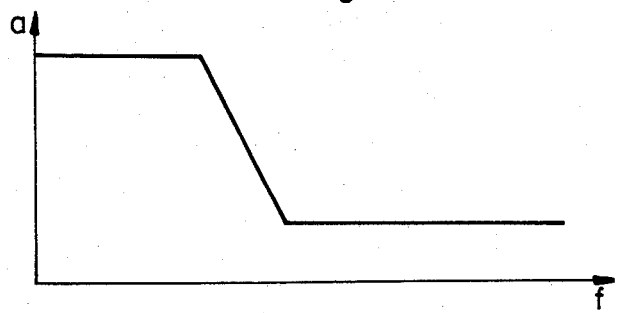
FIG. 11 is a graph showing the amplification—frequency-characteristic of the four-terminal network according to FIG. 10.

If the four-terminal network according to the invention has filter means with the capacitors and between the filter means and the first input terminal 1 as well between them and the first output terminal 3 a respective winding 15 and 16 is in series connected, wherein the end points of the windings 15, 16 lying adjacent to the filter means 20 are connected to one another, (FIG. 10), a low-pass filter is built up. Its characteristic is seen in FIG. 11. This filter does not transmit higher frequencies. The depth and the slope of the characteristic can be regulated by selecting the absolute values of the winding impedance values and their ratio according to the requirements. In the four-terminal network as shown by way of example in FIG. 10 it is advantageous to select equal capacitance values for the capacitors 9 and 10 as well as equal impedance values for the windings 15 and 16.

EXAMPLE 4

Figure 12:
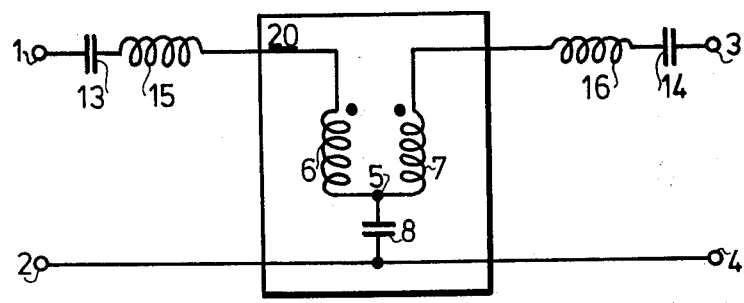
FIG. 12 is a schematic diagram of a four-terminal network according to the invention, usable as a band-pass filter.
Figure 13:
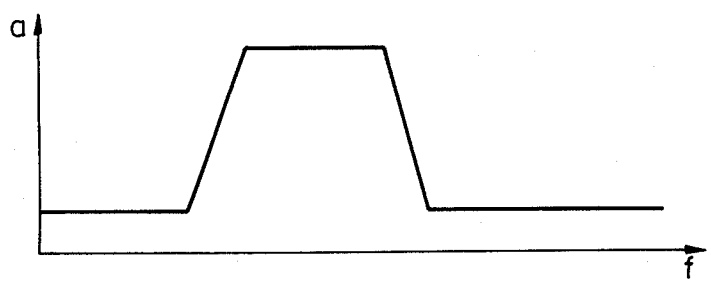
FIG. 13 is a graph showing the amplification—frequency-characteristic of the four-terminal network according to FIG. 12.

The filter means are constructed with one capacitor. Between it and the first input terminal 1 from one side, and the first output terminal 3 from the other side, respective windings 15, 16 and capacitors 13, 14 are connected in series (FIG. 12). In this arrangement the windings 15, 16 are connected to the filter means 20. In this way a band-pass filter is created with a characteristic as shown in FIG. 13. The width of the passed band, the depth of the frequency cross-over and the slope of the transition can be regulated by selecting corresponding values for the circuit elements.

EXAMPLE 5

Figure 14:
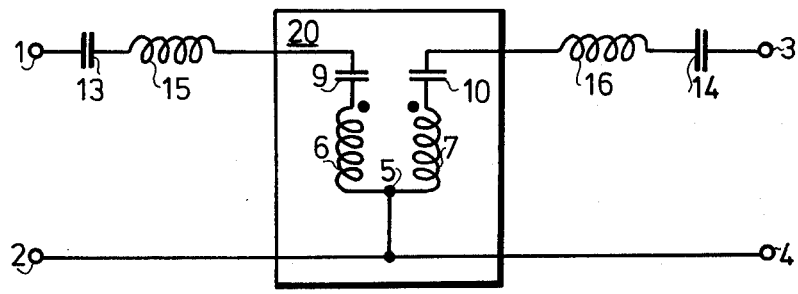
FIG. 14 is a schematic diagram of a four-terminal network according to the invention, intended to select a very narrow frequency value domain that is a "hole selecting filter"
Figure 15:
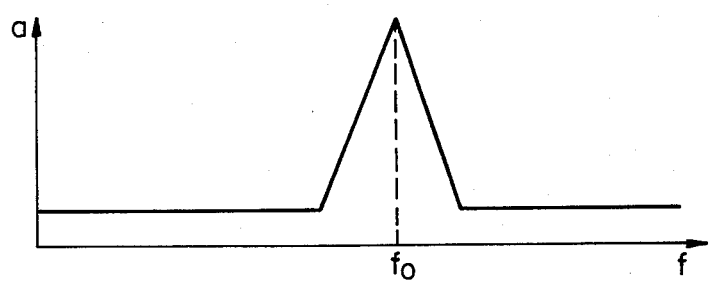
FIG. 15 is a graph showing the amplification—frequency-characteristic of the four-terminal network according to FIG. 14.

The filter means 20 comprise two capacitors 9, 10. The four-terminal network comprises further windings 15, 16 and capacitors 13, 14 connected according to Example 4 (FIG. 14). In this way a filter is provided wherein the band-pass domain is limited to a point. This filter may be called a "hole selecting filter" and has characteristics according to FIG. 15. The characteristic frequency point of this filter is denoted by $f_O$, and it corresponds to the resonance point.

EXAMPLE 6

Figure 16:
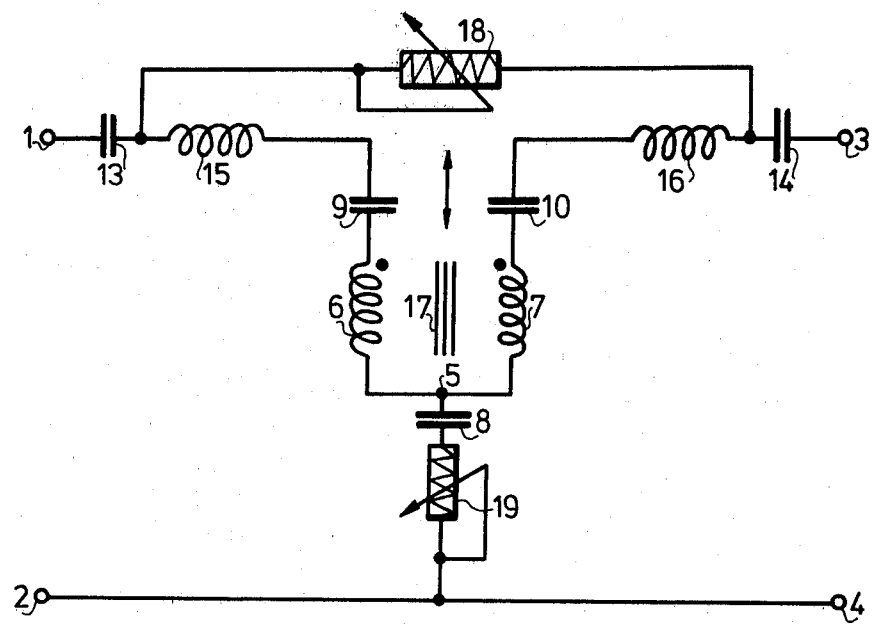
FIG. 16 is a schematic diagram of a four-terminal network according to the invention for realizing many kinds of control functions.

The possibilities of regulating the four-terminal network according to the invention are shown in FIG. 16. These possibilities follow from introducing different control members in different places. For example, by incorporating a resistor 18 between the common points of the winding 15 and capacitor 13 from one side, and of the winding 16 and capacitor 14 from the other side (if the mentioned elements are connected as shown in EXAMPLE 4) the depth of the frequency cross-over is easily changed. The order of placing the mentioned elements determines whether the higher or the lower frequencies will be passed by the filter. Between the capacitor 8 and the output point of the filter means 20 a resistor 19 may be connected. By changing its value the depth of the frequency cross-over may be regulated.

In a great number of application possibilities it is advantageous if the current conducting means 6, 7 of the inductive series means as well as the pairs of the windings 11, 12, 15 and 16 are equipped with respective iron cores. The presence of the iron core results in decreasing slope of the characteristic, but the four-terminal network is able in this case to accept higher power. An interesting possibility follows from the fact that in four-terminal networks with resonance frequency /e.g. the schemes of FIGS. 1 and 14, at this frequency so high forces can come into being as to result in moving the iron core. In this way the four-terminal network according to the invention is unable, not only for measuring and signaling but for switching, too.

The four-terminal network according to the invention ensures filtering and signaling of well-defined frequency value domains (bands and points). It is characterized by high selectivity and if equipped with iron core is able to carry out various switching operations.

Specific representative embodiments and refinements thereto have been discussed in the foregoing passages for the purpose of illustration, but it will be apparent to one skilled in the art that various changes and modifications may be made thereto without departing from the spirit and scope of the invention.

What we claim is:

1. A four-terminal network, comprising:
   a first input terminal;
   a second input terminal;
   a first output terminal;
   a second output terminal connected to said first input terminal at an intermediate point;
   a first inductance winding having one end connected to said first input terminal, an opposite end and a plurality of turns for conducting current;
   a second inductance winding having one end connected to said first output terminal, an opposite end connected to said opposite end of said first inductance winding at a common point, and a plurality of turns; and
   a condenser connected between said common point and said intermediate point;
   said first and second inductance windings being selected to have substantially identical inductance, to be disposed clearly adjacent each other with each turn of said first inductance winding being adjacent a respective turn of said second inductance winding, said turns of said first and second inductance windings being disposed so that current flows in said first inductance winding in a direction opposite to the direction in which current flows in said second inductance winding, and said first and second inductance windings extending parallel to each other.

2. A four-terminal network according to claim 1, wherein said first and second inductance windings are bifilar wound about a common core each winding made of the same electrical material and having the same number of turns, said turns of said first winding being in surface contact with said turns of said second winding.

3. A four-terminal network according to claim 1, wherein said network consists essentially of said first and second windings and said condenser, said condenser connected directly between said intermediate point and said common point.

4. A four-terminal network according to claim 1, including a third inductance winding connected between said first input terminal and said one end of said first inductance winding, and a fourth inductance winding connected between said one end of said second inductance winding and said first input terminal.

5. A four-terminal network according to claim 4, including a second condenser connected in parallel to said third winding and a third condenser connected in parallel to said fourth winding.

6. A four-terminal network according to claim 5, including a second condenser connected in series with said third winding and a third condenser connected in series with said fourth winding.

7. A four-terminal network according to claim 1, including a second condenser connected between said one end of said inductance winding and said first input terminal and a third condenser connected between said one end of said second winding and said first output terminal.

* * * * *